United States Patent
Chen (10) Patent No.: US 7,595,672 B2
(45) Date of Patent: Sep. 29, 2009

(54) ADJUSTABLE DIGITAL LOCK DETECTOR

(75) Inventor: Tse-Peng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 11/861,260

(22) Filed: Sep. 25, 2007

(65) Prior Publication Data
US 2009/0079479 A1    Mar. 26, 2009

(51) Int. Cl.
*H03L 7/06*  (2006.01)
(52) U.S. Cl. .............. 327/158; 327/156; 327/159; 327/160
(58) Field of Classification Search ........... 327/156, 327/158, 159
See application file for complete search history.

(56) References Cited

U.S. PATENT DOCUMENTS

| | | | |
|---|---|---|---|
| 6,760,394 B1* | 7/2004 | Cao et al. | 375/374 |
| 6,879,195 B2* | 4/2005 | Green et al. | 327/147 |
| 6,998,889 B2* | 2/2006 | Best | 327/157 |

* cited by examiner

*Primary Examiner*—Lincoln Donovan
*Assistant Examiner*—John W Poos
(74) *Attorney, Agent, or Firm*—Winston Hsu (57) ABSTRACT

An adjustable digital lock detector for a phase-locked loop (PLL) has a variable counter for outputting an output signal corresponding to a first clock signal, a target count number signal, and a count number offset signal, a latch for sampling the output signal of the variable counter and outputting a latch output signal according to a result of sampling the output signal, a lead/lag detector for receiving the latch output signal and outputting the count number offset signal according to a predetermined state of the latch output signal, and an arbiter for receiving the latch output signal and outputting an arbiter output signal according to the latch output signal and a second clock signal.

14 Claims, 7 Drawing Sheets

ADJUSTABLE DIGITAL LOCK DETECTOR

BACKGROUND OF THE INVENTION

1. Field of the Invention

The present invention relates to lock detectors for phase-locked loops (PLL), and particularly to an adjustable digital lock detector.

2. Description of the Prior Art

Phase-locked loops (PLL) are a category of electronic circuits that generate an oscillating signal having phase and frequency matching an incoming signal. In practical application, the PLL can be used for generating a clock signal (the oscillating signal) that tracks the phase and frequency of a data signal (the incoming signal). In addition to synchronization applications, as described above, the PLL can also be used to demodulate frequency modulated (FM) signals, and as frequency synthesizers for generating stable, high-frequency clock signals from a lower frequency reference signal.

It is of interest to other circuits that utilize the clock signal generated by the PLL to know when the clock signal is locked to the data signal. In general, a lock detector is a circuit utilized to provide a lock indicator when the clock signal and the data signal are synchronized. In practice, a perfect phase/frequency lock between the clock signal and the data signal is impossible, and typically an acceptable amount of error is present in the phase/frequency lock. Thus, the lock detector will often determine whether the errors in the phases/frequencies of the clock signal and the data signal are within a specific window.

Figure 1:
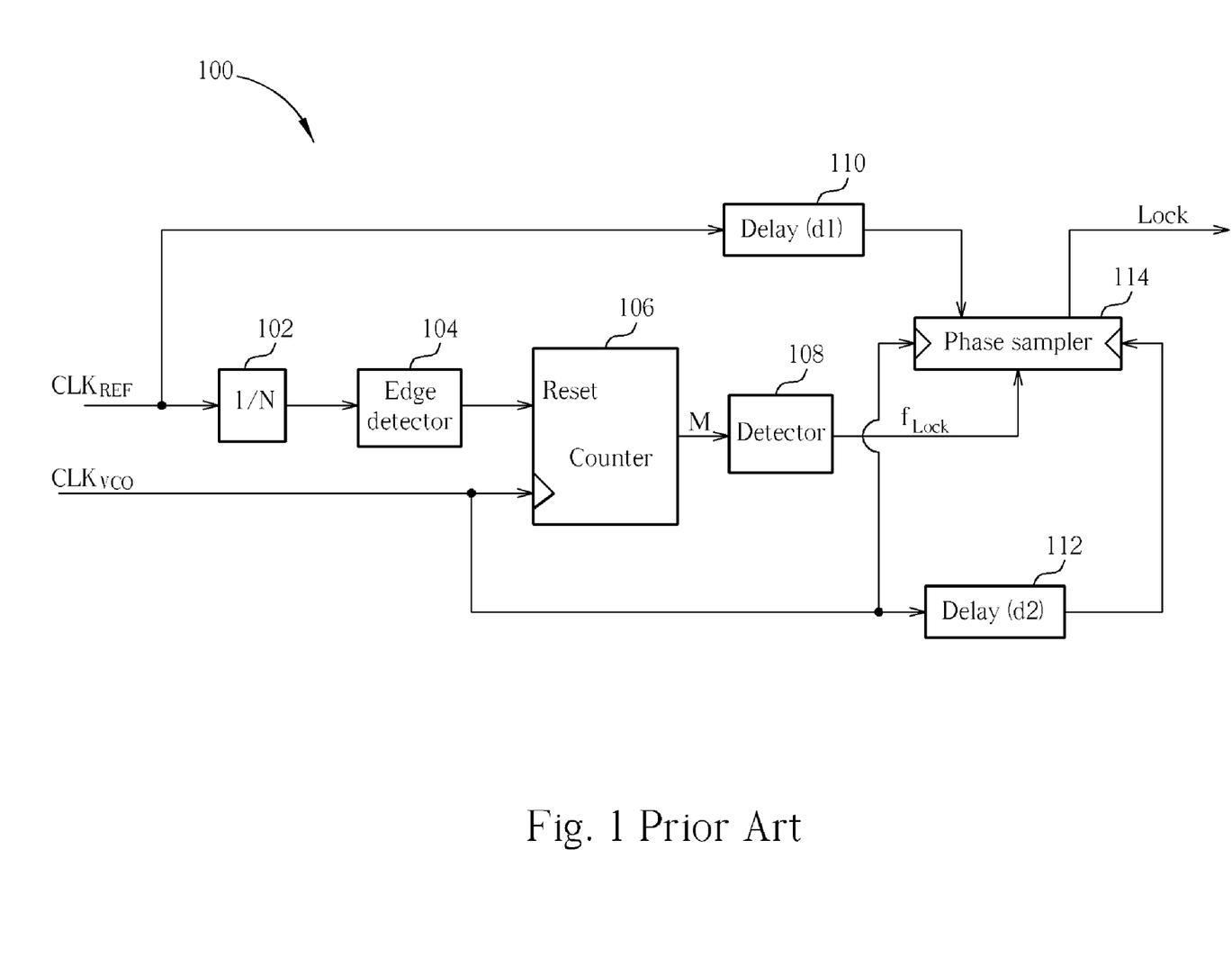
FIG. 1 is a diagram of a lock detector according to the prior art.

Please refer to FIG. 1, which is a diagram of a lock detector 100 according to the prior art. The lock detector 100 compares a reference clock $CLK_{REF}$ to an oscillator clock $CLK_{VCO}$ to generate a lock signal LOCK. The lock detector 100 comprises a frequency divider 102, an edge detector 104, a counter 106, a detector 108, a first delay circuit 110, a second delay circuit 112, and a phase sampler 114. The frequency divider 102 receives the reference clock $CLK_{REF}$, and divides it by N. The edge detector 104 detects positive or negative edges of the divided oscillator clock such that the counter 106 counts edges of the divided oscillator clock to generate a count number M. When the count number M is equal to N, the frequencies of the reference clock $CLK_{REF}$ and the oscillator clock $CLK_{VCO}$ are matched. The phase sampler 114 compares the reference clock $CLK_{REF}$ after the first delay circuit 110 with the oscillator clock $CLK_{VCO}$. If the phase of the delayed reference clock falls between the phase of the oscillator clock $CLK_{VCO}$ and the phase of the oscillator clock $CLK_{VCO}$ after the second delay circuit 112, i.e. a locking window, the phase sampler 114 generates the lock signal LOCK, indicating that the PLL has successfully locked the frequency and the phase.

In the lock detector 100 of the prior art, the first delay circuit 110 and the second delay circuit 112 are both analog delay circuits. Thus, the delays provided by the first delay circuit 110 and the second delay circuit 112 are susceptible to process, temperature, and bias voltage variation.

SUMMARY OF THE INVENTION

According to the present invention, an adjustable digital lock detector for a phase-locked loop (PLL) comprises a variable counter, a latch, a lead/lag detector, and an arbiter. The variable counter comprises a count number terminal for inputting a count number signal, a clock terminal for inputting a first clock signal, an offset terminal for inputting a count number offset signal, an output terminal for outputting an output signal corresponding to the first clock signal, the count number signal, and the count number offset signal for establishing a locking window, and a reset terminal for receiving a second clock signal for toggling the output signal to a predetermined state. The latch comprises a latch input terminal coupled to the output terminal of the variable counter for sampling the output signal of the variable counter, a latch output terminal for outputting a latch output signal according to a result of sampling the output signal of the variable counter for indicating a lead state or a lag state in response to an edge of the reference clock and a transition of the output signal, and a latch enable terminal for receiving the second clock signal for enabling sampling of the output signal of the variable counter. The lead/lag detector comprises a lead/lag input terminal coupled to the latch output terminal for receiving the latch output signal, and a lead/lag output terminal for outputting the count number offset signal according to the state of the latch output signal. The arbiter comprises an arbiter input terminal coupled to the latch output terminal for receiving the latch output signal, an arbiter clock terminal for receiving the second clock signal, and an arbiter output terminal for outputting an arbiter output signal according to the latch output signal and the second clock signal for indicating that the input clock is substantially locked to the reference clock within the locking window.

According to another embodiment of the present invention, an adjustable digital lock detector comprises a variable counter, a state detector, and an arbiter. The variable counter receives an input clock and a reference clock, and generates an output signal. The variable counter counts the edge number of the input clock up to a target count number, and sets the output signal to a transition. The target count number includes a predetermined number and an offset number so as to define a locking window. The state detector is coupled to the variable counter for generating a latch signal indicating either a lead state or a lag state in response to an edge of the reference clock and the transition of the output signal, and adjusting the offset number accordingly. The arbiter is coupled to the state detector for generating a lock signal indicating that the input clock is substantially locked to the reference clock within the locking window.

According to the present invention, a method of detecting a lock between an input clock and a reference clock in a phase-locked loop comprises providing a locking window based on a predetermined number and a variable offset number, transitioning a variable counter output signal when a number of edges is counted to a sum of the predetermined number and the variable offset number, generating a latch signal according to an edge of the reference clock and the variable counter output signal transition, adjusting the variable offset number according to the latch signal, and generating a lock signal when the input clock is substantially locked to the reference clock within the locking window.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
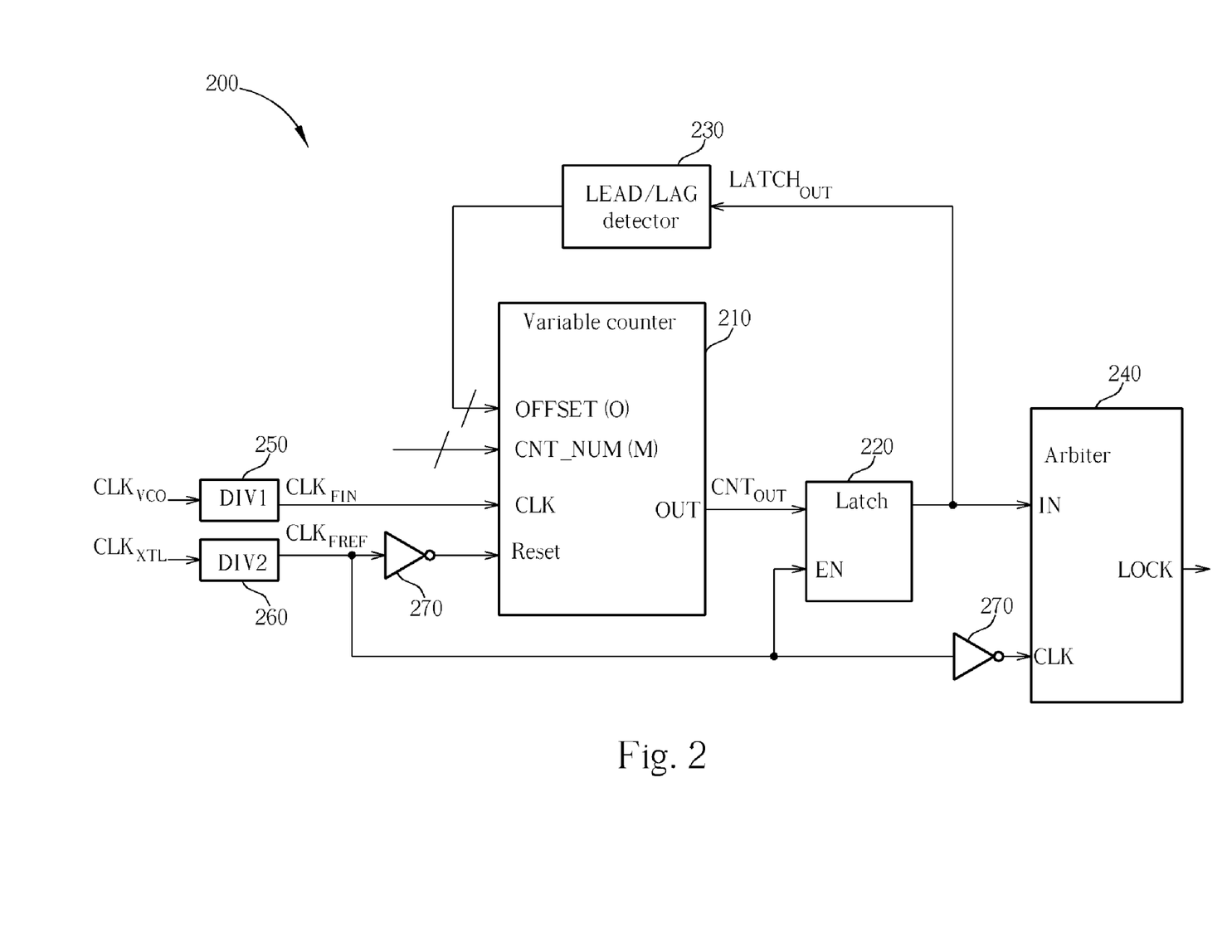
FIG. 2 is a diagram of an adjustable digital lock detector according to the present invention.

Please refer to FIG. 2, which is a diagram of an adjustable digital lock detector 200 according to the present invention. The adjustable digital lock detector 200 comprises a variable counter 210, a latch 220, a lead/lag detector 230, and an arbiter 240. The adjustable digital lock detector 200 takes an oscillator clock $CLK_{VCO}$, a crystal clock $CLK_{XTL}$, and a count number M as inputs, and outputs a lock signal LOCK.

The variable counter 210 has five terminals: a clock terminal CLK, a count number terminal CNT_NUM(M), an offset terminal OFFSET(O), a reset terminal Reset, and an output terminal OUT. A reference clock $CLK_{FREF}$ is applied at the reset terminal Reset through an inverter 270 and an input clock $CLK_{FIN}$ is applied at the clock terminal CLK. The counter terminal CNT_NUM(M) is used to receive a count number M, and the offset terminal OFFSET(O) is used to receive a positive offset number $O_1$ or a negative offset number $-O_2$. The output terminal OUT is employed to generate a counter output $CNT_{OUT}$. The variable counter 210 counts up according to the input clock $CLK_{FIN}$ at the clock terminal CLK until the count reaches a target count number $(M+O_1)$ or $(M-O_2)$, to be described in the following. When the count reaches the target count number $(M+O_1)$ or $(M-O_2)$, the counter output signal $CNT_{OUT}$ at the output terminal OUT transitions from logic-low to logic-high. At the negative edge of the reference clock $CLK_{FREF}$, the count number of the variable counter 210 is reset, and after the counter output signal $CNT_{OUT}$ is changed from 1 to 0, the variable counter 210 begins counting either to $(M+O_1)$ or $(M-O_2)$. The variable counter 210 counts to $(M+O_1)$ or $(M-O_2)$ depending on previous counting state, whether the positive edge of the counter output signal $CNT_{OUT}$ leads or lags the positive edge of the reference clock $CLK_{FREF}$, respectively. The count number M can be expressed as:

$$M = \frac{T_{CLKFREF}}{2 * T_{CLKFIN}}$$

where $T_{CLKFREF}$ is the period of the reference clock $CLK_{FREF}$, and $T_{CLKFIN}$ is the period of the input clock $CLK_{FIN}$.

The latch 220 samples the value of the counter output signal $CNT_{OUT}$ and holds the value at a latch output $LATCH_{OUT}$ of the latch 220. Sampling of the value of the counter output signal $CNT_{OUT}$ is triggered by an edge of a reference clock $CLK_{FREF}$ at an enable terminal EN of the latch circuit 220. The reference clock $CLK_{FREF}$ also acts as the signal at the reset terminal Reset.

Figure 4:
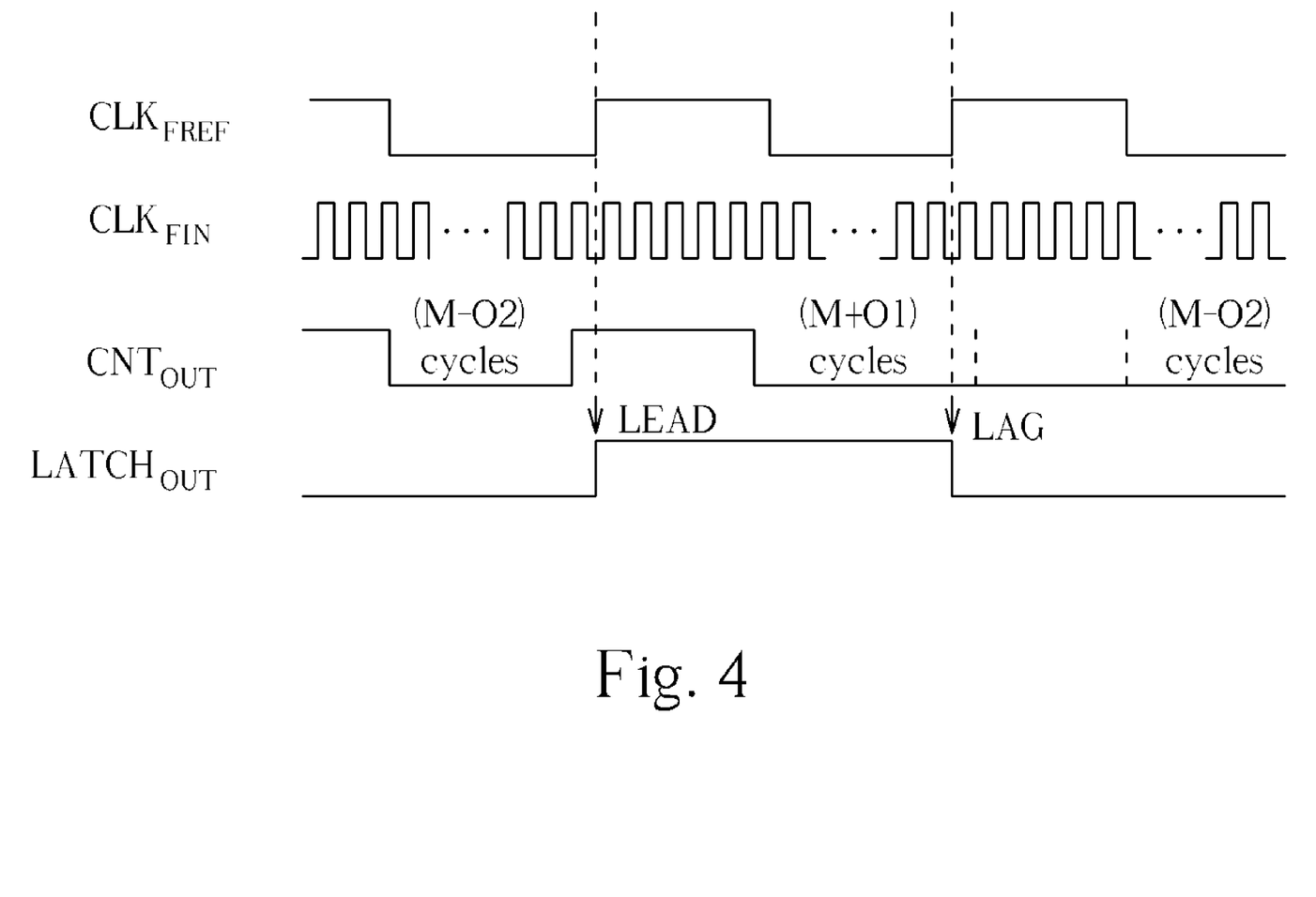
FIGS. 4 to 7 illustrate a digitally-controlled locking window used by the adjustable digital lock detector of the present invention.

The adjustable digital lock detector 200 of the present invention differentiates itself from the prior art in its use of a frequency comparison delay, which is used to set a digitally-controlled locking window. The adjustable digital lock detector 200 of the present invention uses the combination of the count number M and the offset numbers $O_1$ and $-O_2$ to establish a digitally-controlled locking window. This prevents errors generated by variations in the delay line because of process or temperature. Please refer to FIGS. 4-7, which illustrate the digitally-controlled locking window used by the adjustable digital lock detector 200 of the present invention. The lead/lag detector 230 of the present invention takes the latch output $LATCH_{OUT}$ as input, and outputs the offset value O (either $O_1$ or $-O_2$). If the lead/lag detector 230 determines a lead condition, i.e. the latch output $LATCH_{OUT}$ is 1, then the lead/lag detector 230 provides the positive offset value $O_1$, so as to change the target count value of the variable counter 210 to $(M+O_1)$ for a next counting state. On the other hand, if the lead/lag detector 230 determines a lag condition, i.e. the latch output $LATCH_{OUT}$ is 0, then the lead/lag detector 230 provides the negative offset value $-O_2$, so as to change the target count value of the variable counter 210 to $(M-O_2)$ for the next counting state. These two situations are illustrated in FIG. 4.

Figure 5:
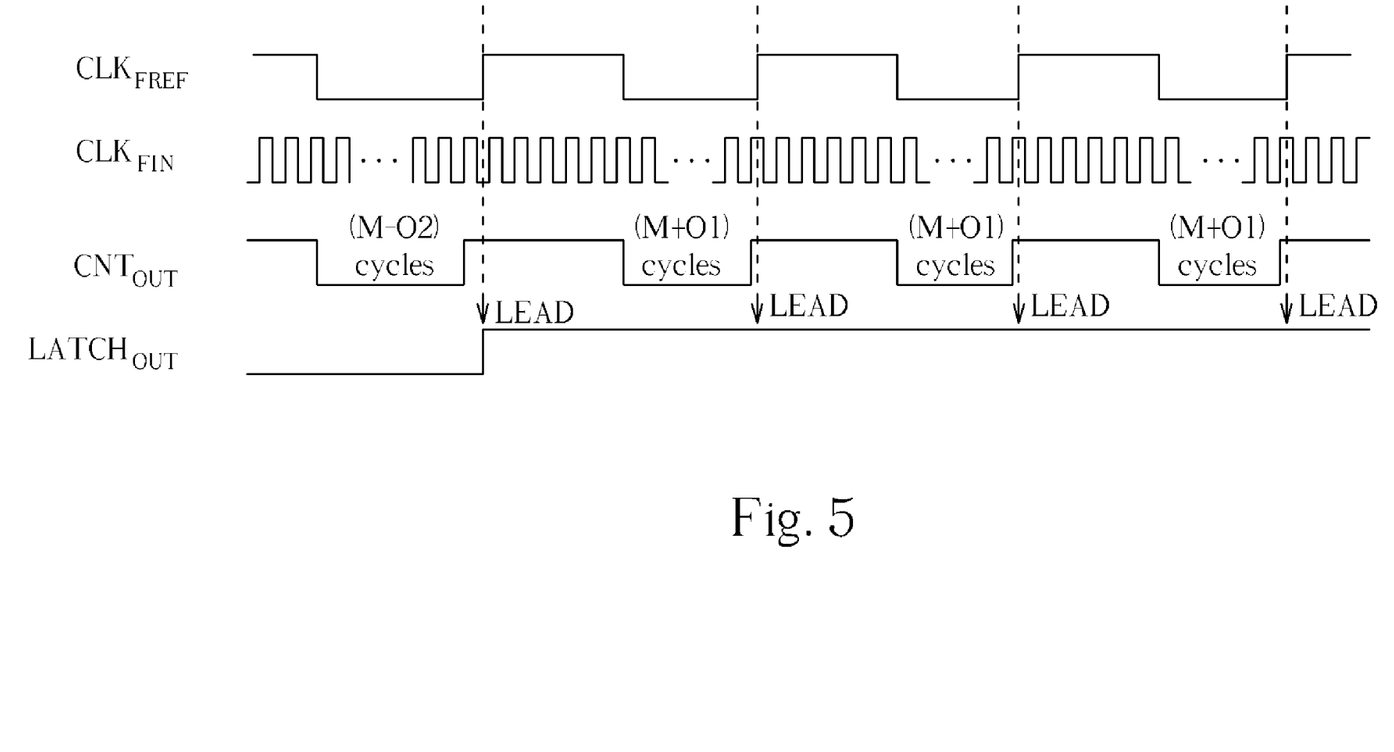
Figure 6:
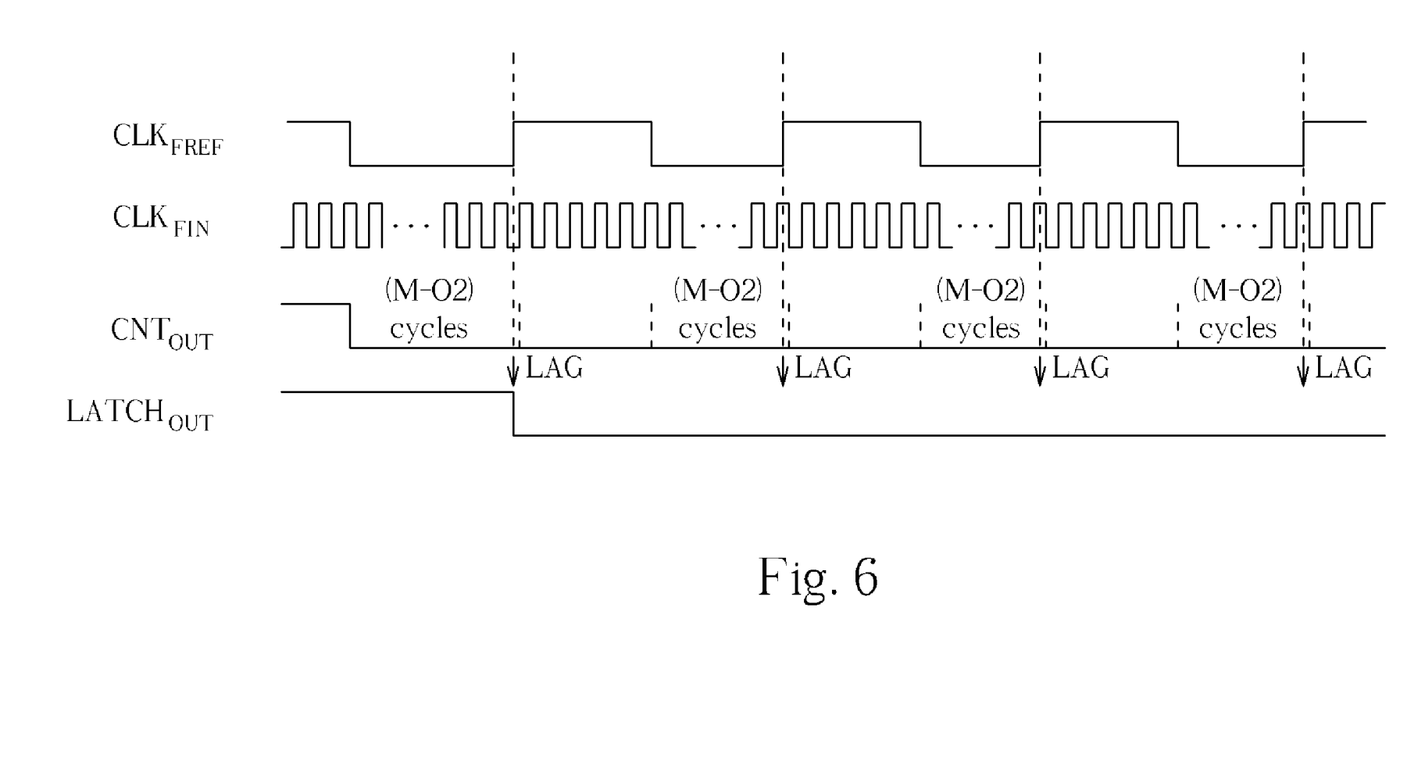
Figure 7:
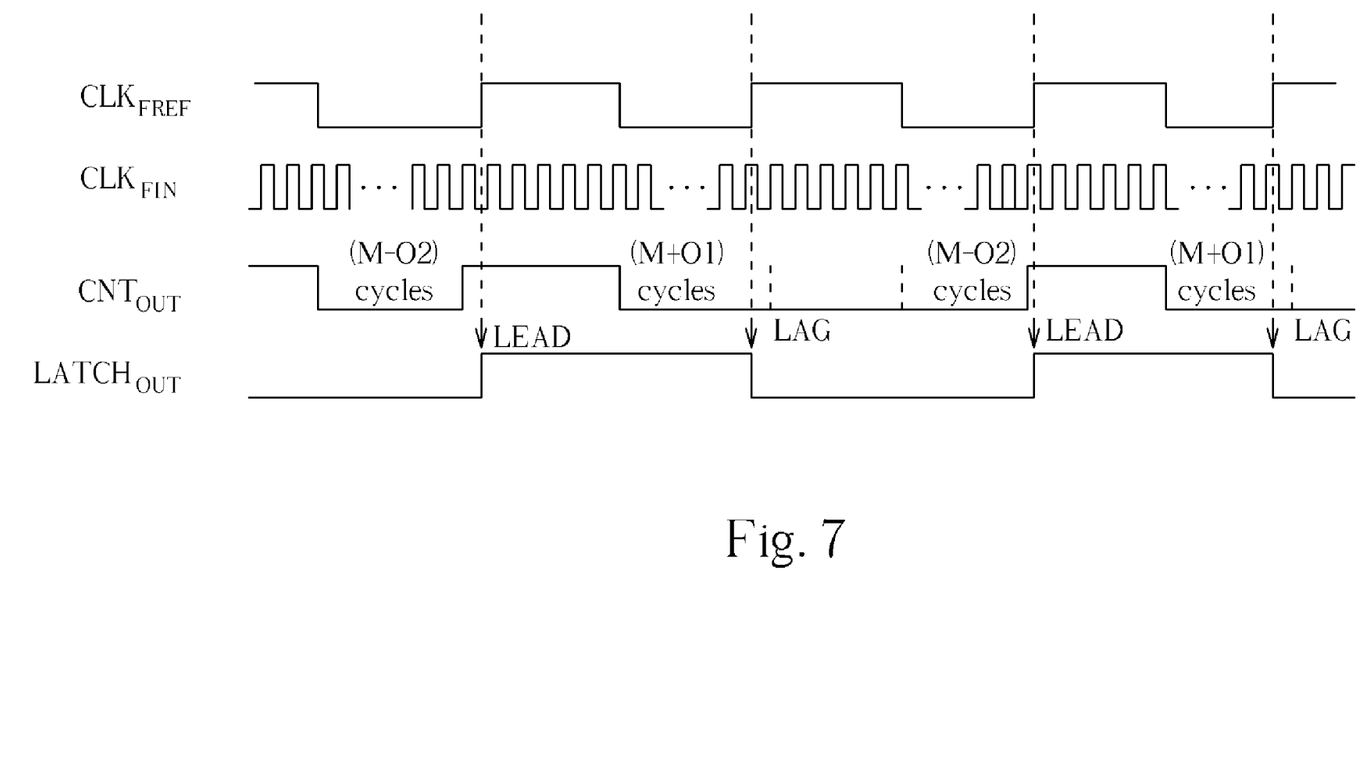

When the phase-locked loop is not yet locked, and the input signal frequency is higher than (leads) the reference frequency, the adjustable digital lock detector 200 operates as shown in FIG. 5. When the phase-locked loop is not yet locked, and the input signal frequency is lower than (lags) the reference frequency, the adjustable digital lock detector 200 operates as shown in FIG. 6. When the phase-locked loop enters the locking window, the adjustable digital lock detector 200 operates as shown in FIG. 7. By modifying the values of the positive offset $O_1$ and the negative offset $-O_2$, the size of the locking window can be increased or decreased, thereby accomplishing adjustability in the design of the adjustable digital lock detector 200.

The lock detector 200 further comprises a first frequency divider 250, a second frequency divider 260, and two inverters 270, as shown in FIG. 2. The first frequency divider 250 divides the voltage-controlled oscillator (VCO) clock $CLK_{VCO}$ to generate the input clock $CLK_{FIN}$, and the second frequency divider 260 divides the crystal clock $CLK_{XTL}$ to generate the reference clock $CLK_{FREF}$. The inverters 270 invert the reference clock $CLK_{\_FREF}$ for input to the variable counter 210 and the arbiter 240. While included in the diagram shown in FIG. 2, the first frequency divider 250, the second frequency divider 260, and the two inverters 270 are not strictly necessary for enabling the present invention lock divider.

Figure 3:
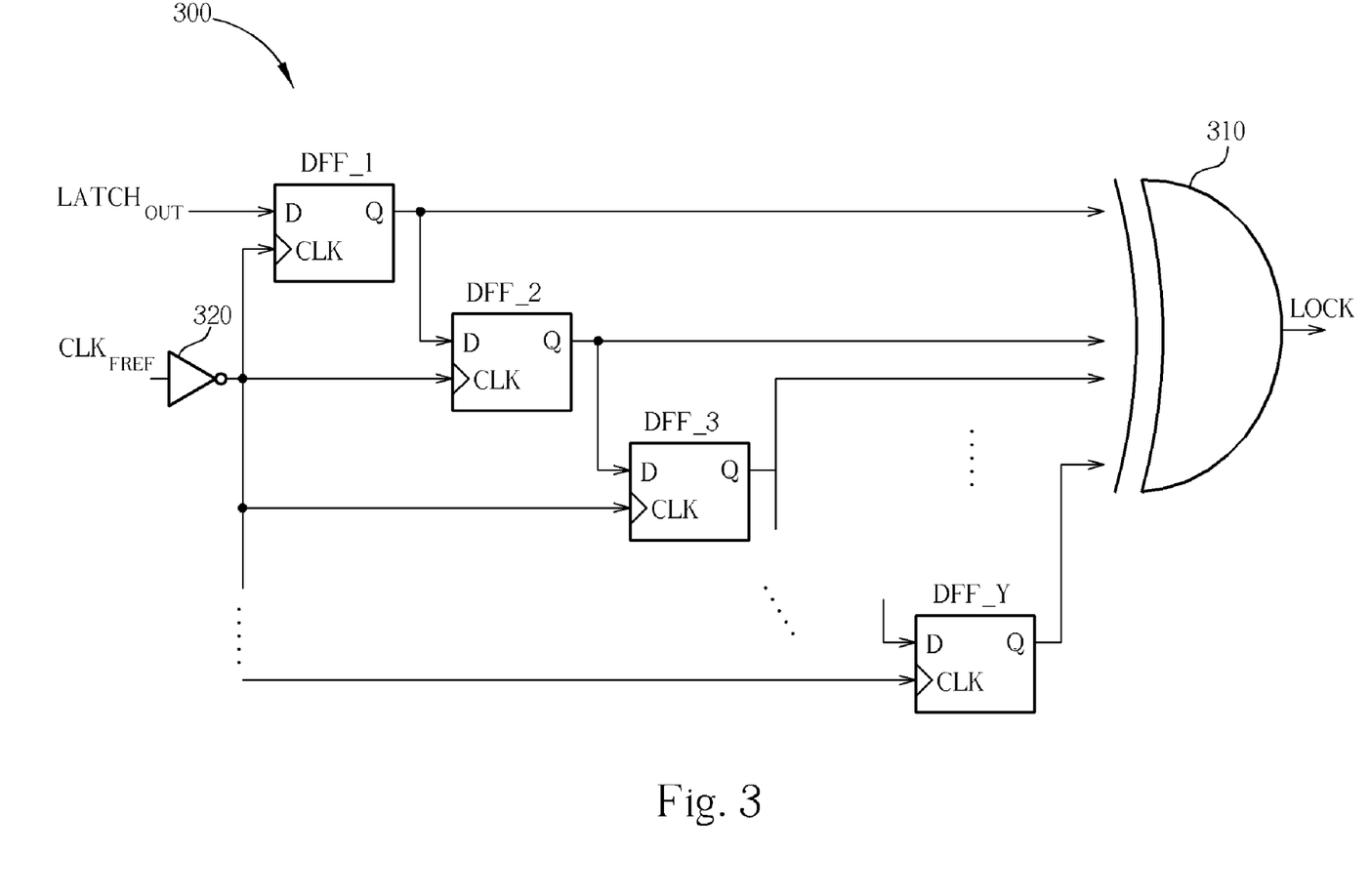
FIG. 3 is a diagram of an arbiter of the adjustable digital lock detector of FIG. 2.

The arbiter 240 takes the latch output $LATCH_{OUT}$ as an input IN, and outputs a lock signal LOCK according to the input IN and the reference clock $CLK_{FREF}$. Please refer to FIG. 3, which is a diagram of the arbiter 240 of FIG. 2. The arbiter 240 comprises a plurality of D flip flops DFF_1-DFF_Y, and an exclusive OR (XOR) gate 310. The D flip flops DFF_1-DFF_Y are controlled by the reference clock $CLK_{FREF}$, which is inverted by an inverter 320, and each successive D flip flop takes its input from the D flip flop directly preceding it. For example, the D flip flop DFF_2 takes its input from the D flip flop DFF_1. Of course, the D flip flop DFF_1 takes its input from an external source: the latch output $LATCH_{OUT}$. In this way, the XOR gate 310 will output the lock signal LOCK as long as inputs from the plurality of D flip flops DFF_1-DFF_Y are not all the same. For example, if the inputs from the D flip flops DFF_2-DFF_Y are all 1, but the input from the D flip flop DFF_1 is 0, then the XOR gate 310 will output the LOCK signal. The number of D flip flops in the arbiter 240 determines a level of sensitivity of the arbiter 240. More D flip flops corresponds to less sensitivity, whereas fewer D flip flops, with a minimum of two D flip flops, corresponds to greater sensitivity.

In operation, the present invention lock detector 200 uses the digitally generated counter output $CNT_{OUT}$ to determine if the input clock $CLK_{FIN}$ is leading or lagging the reference clock $CLK_{FREF}$. For example, if the target M is 8, and the initial value of the offset O is −1, the lead/lag detector 230 will output the offset O as +1 when the lead/lag detector 230 detects that the input clock $CLK_{FIN}$ leads the reference clock $CLK_{REF}$. When the lead/lag detector 230 detects that the input clock $CLK_{FIN}$ lags the reference clock $CLK_{REF}$, the lead/lag detector 230 outputs the offset O as −1. In other words, the target count number of the variable counter 210 will be set to 9 for the next counting state when the input clock $CLK_{FIN}$ leads the reference clock $CLK_{REF}$, and the target count number of 210 will be set to 7 for the next counting state when the input clock $CLK_{FIN}$ lags the reference clock $CLK_{REF}$. Thus, if the input clock $CLK_{FIN}$ frequency is equal to (8*2)=16 times the reference clock $CLK_{REF}$ frequency, i.e. the reference clock $CLK_{REF}$ resets the variable counter 210, and then enables the lead/lag detector after 8 periods of the input clock $CLK_{FIN}$, then the counter output $CNT_{OUT}$ will alternate for each period of the reference clock $CLK_{REF}$, since the target count number is alternating between 7 and 9. If the frequency of the input clock $CLK_{FIN}$ is higher than (9*2)=18 times the frequency of the reference clock $CLK_{REF}$, e.g. 19 times the reference clock $CLK_{REF}$ frequency, then the target count number will always be set to 9, and the variable counter 210 will have a constant output, e.g. 1. On the other hand, if the frequency of the input clock $CLK_{FIN}$ is lower than (7*2)=14 times the frequency of the reference clock $CLK_{REF}$, e.g. 13 times the reference clock $CLK_{REF}$ frequency, then the target count number will always be set to 7, and the variable counter 210 will also have a constant output, e.g. 0. The arbiter 240 will only output the lock signal that corresponds to a lock condition when the counter output $CNT_{OUT}$ detected through the latch 220 alternates, and this will only happen as the frequency of the input clock $CLK_{FIN}$ is in a window of 14 to 18 times the frequency of the reference clock $CLK_{REF}$. By changing the value of the offsets $O_1$ and $O_2$, the size of the locking window of the digital lock detector 200 can be adjusted easily and precisely.

It is worthy of note that the present invention lock detector circuit can be implemented in hardware, software, or as an embedded circuit.

In summary, the present invention adjustable digital lock detector 200 provides detection of the lock condition for the PLL through the variable counter 210, which is a digital circuit. Thus, the present invention adjustable digital lock detector 200 is less vulnerable to process, temperature, and bias voltage variation, and only relies on the reference clock $CLK_{REF}$, which can be generated by a crystal, which has very low vulnerability to process and temperature variation. The adjustable digital lock detector is also able to adjust the size of the locking window easily and precisely.

Those skilled in the art will readily observe that numerous modifications and alterations of the device and method may be made while retaining the teachings of the invention.

What is claimed is:

1. An adjustable digital lock detector comprising:
   a second frequency divider for generating a reference clock according to a crystal oscillator signal;
   a variable counter for receiving an input clock and the reference clock, and generating an output signal, the variable counter counting the edge number of the input clock up to a target count number and setting the output signal to a transition, wherein the target count number includes a predetermined number and an offset number so as to define a locking window;
   a state detector coupled to the variable counter for generating a latch signal indicating either a lead state or a lag state in response to an edge of the reference clock and the transition of the output signal, and adjusting the offset number accordingly; and
   an arbiter coupled to the state detector for generating a lock signal indicating that the input clock is substantially locked to the reference clock within the locking window.

2. The adjustable digital lock detector of claim 1, wherein the state detector comprises:
   a latch for generating the latch signal in response to the output signal of the variable counter and the reference clock; and
   a lead/lag detector coupled to the latch for adjusting the offset number in response to the latch signal.

3. The adjustable digital lock detector of claim 1, wherein the arbiter is an up/down counter.

4. The adjustable digital lock detector of claim 1, wherein the arbiter comprises:
   a plurality of flip-flops coupled in series and clocked by the reference clock, wherein the plurality of flip-flops has a first stage for receiving the latch signal; and
   a logic gate coupled to the plurality of flip-flops for generating the indication signal in response to outputs of the plurality of flip-flops.

5. The adjustable digital lock detector of claim 4, wherein the logic gate is an XOR gate.

6. The adjustable digital lock detector of claim 1 further comprising a first frequency divider for generating the input clock according to a voltage-controlled oscillator (VCO) signal.

7. The adjustable digital lock detector of claim 1 further comprising a first inverter coupled between the second frequency divider and the reset terminal, and a second inverter coupled between the second frequency divider and the arbiter clock terminal.

8. An adjustable digital lock detector comprising:
   a first frequency divider for generating an input clock according to a voltage-controlled oscillator signal;
   a variable counter for receiving the input clock and a reference clock, and generating an output signal, the variable counter counting edge number of the input clock up to a target count number and setting the output signal to a transition, wherein the target count number includes a predetermined number and an offset number so as to define a locking window;
   a state detector coupled to the variable counter for generating a latch signal indicating either a lead state or a lag state in response to an edge of the reference clock and the transition of the output signal, and adjusting the offset number accordingly; and
   an arbiter coupled to the state detector for generating a lock signal indicating that the input clock is substantially locked to the reference clock within the locking window.

9. The adjustable digital lock detector of claim 8, further comprising:
   a second frequency divider for generating the reference clock according to a crystal oscillator (XTAL) signal.

10. The adjustable digital lock detector of claim 9, further comprising:
    a first inverter coupled between the second frequency divider and the reset terminal, and a second inverter coupled between the second frequency divider and the arbiter clock terminal.

11. The adjustable digital lock detector of claim 8, wherein the state detector comprises:
    a latch for generating the latch signal in response to the output signal of the variable counter and the reference clock; and
    a lead/lag detector coupled to the latch for adjusting the offset number in response to the latch signal.

12. The adjustable digital lock detector of claim 8, wherein the arbiter is an up/down counter.

13. The adjustable digital lock detector of claim 8, wherein the arbiter comprises:

a plurality of flip-flops coupled in series and clocked by the reference clock, wherein the plurality of flip-flops has a first stage for receiving the latch signal; and a logic gate coupled to the plurality of flip-flops for generating the indication signal in response to outputs of the plurality of flip-flops.

14. The adjustable digital lock detector of claim 13, wherein the logic gate is an XOR gate.

* * * * *